(12) United States Patent
Nam

(10) Patent No.: US 7,682,894 B2
(45) Date of Patent: Mar. 23, 2010

(54) FLASH MEMORY AND A METHOD OF MANUFACTURING THE SAME

(75) Inventor: Sang-Woo Nam, Chungcheongbuk-do (KR)

(73) Assignee: Dongku HiTek Co., Seoul (KR)

( * ) Notice: Subject to any disclaimer, the term of this patent is extended or adjusted under 35 U.S.C. 154(b) by 291 days.

(21) Appl. No.: 11/320,606

(22) Filed: Dec. 30, 2005

(65) Prior Publication Data

US 2007/0052005 A1    Mar. 8, 2007

(30) Foreign Application Priority Data

Sep. 5, 2005    (KR) ................. 10-2005-0082220

(51) Int. Cl.
*H01L 21/8238* (2006.01)
(52) U.S. Cl. ............... 438/201; 438/221; 438/257; 438/258; 438/593; 257/239; 257/261; 257/298; 257/315; 257/322
(58) Field of Classification Search ........ 438/201, 438/211, 257, 258, 593, FOR. 203; 257/315, 257/239, 261, 298, 322, E21.422, E21.68, 257/E21.687, E21.688, E29.129, E29.3; 365/185.01; 430/4, 5; 258/E21.026, E21.206, E21.148
See application file for complete search history.

(56) References Cited

U.S. PATENT DOCUMENTS

| | | | |
|---|---|---|---|
| 5,702,968 A * | 12/1997 | Chen ............... | 438/253 |
| 6,593,186 B1 * | 7/2003 | Kitamura et al. ........ | 438/257 |
| 6,930,349 B2 * | 8/2005 | Lin et al. ............ | 257/315 |
| 2002/0179962 A1 * | 12/2002 | Kinoshita ............ | 257/315 |
| 2004/0043638 A1 * | 3/2004 | Nansei et al. ......... | 438/792 |
| 2004/0070022 A1 * | 4/2004 | Itou et al. ........... | 257/314 |
| 2004/0264246 A1 * | 12/2004 | Sakui et al. .......... | 365/185.01 |

FOREIGN PATENT DOCUMENTS

JP    05090610 A  *  4/1993

* cited by examiner

*Primary Examiner*—Lynne A. Gurley
*Assistant Examiner*—Meiya Li
(74) *Attorney, Agent, or Firm*—Sherr & Vaughn PLLC

(57) ABSTRACT

The present invention provides a method of manufacturing a flash memory device. The method includes forming a gate oxide layer on a semiconductor substrate, forming a floating gate including protrusions and depressions on its surface by patterning polysilicon deposited on the gate oxide layer, depositing a dielectric layer on the floating gate and the gate oxide layer, and forming a control gate by patterning polysilicon deposited on the dielectric layer.

14 Claims, 7 Drawing Sheets

FLASH MEMORY AND A METHOD OF MANUFACTURING THE SAME

CROSS-REFERENCE TO RELATED APPLICATION

This application claims priority to and the benefit of Korean Patent Application No. 10-2005-0082220 filed in the Korean Intellectual Property Office on Sep. 5, 2005, the entire contents of which are incorporated herein by reference.

BACKGROUND OF THE INVENTION (a) Field of the Invention

The present invention relates to a flash memory device and a method of manufacturing the same. More particularly, the present invention relates to a flash memory device including protrusions and depressions on a floating gate, and a method of manufacturing the same.

(b) Description of the Related Art

Generally, a flash memory is devised to combine advantages of both EPROM (erasable programmable read only memory) and EEPROM (electrically erasable PROM), which provides a device enabling electrical data programming and erasing with a low manufacturing cost due to a simple manufacturing process and small chip size.

Flash memory is a non-volatile semiconductor memory in which data is not destroyed by breakage of a power supply, which also has a property of RAM (random access memory) meaning that programming and erasing of information can be easily performed electrically in a system. Due to the above characteristics, flash memory is used for a memory card, as a memory device substituting a hard disk of portable office automation instruments, and so on.

Data programming of a flash memory is performed by implantation of hot electrons. That is, when hot electrons are generated in a channel due to a potential difference between a source and a drain, some electrons that obtain energy of equal to or more than a potential barrier between a gate polysilicon and an oxide move to, and are stored in, a floating gate by a high electric field applied to a control gate.

Hereinafter, a conventional flash memory device will be briefly described with reference to FIG. 1 to FIG. 3.

FIG. 1 is a top plan view with respect to a single cell in a flash memory, and FIG. 2 and FIG. 3 are respectively cross-sectional views along lines II-II and III-III in FIG. 1.

As shown in FIG. 1 to FIG. 3, a gate oxide layer 20 is formed in a portion of a device region in a semiconductor substrate 100, and a floating gate 30 including polysilicon is formed on the gate oxide layer 20. Since the floating gate 30 is not connected to an outside, it performs a function of a storage node for electrons.

In addition, a dielectric layer 40 is formed on the floating gate 30. The dielectric layer 40 includes an ONO structure in which an oxide layer, a nitride layer, and an oxide layer are sequentially accumulated.

Subsequently, a control gate 50 including polysilicon is formed on the dielectric layer 40, and it performs a function of a gate at a general MOS transistor. In addition, a spacer (not shown) is formed on sidewalls of a gate including a gate oxide layer 20, floating gate 30, dielectric layer 40, and control gate 50, and then an LDD (Lightly doped drain) (not shown) is formed on the semiconductor substrate 100 below the spacer by ion-implanting low-concentration impurities having opposite conductivity to that of the semiconductor substrate 100. By ion-implanting high concentration impurities having the same conductivity as that of the LDD, a source region 70 and a drain region 80 are formed in the exposed portion of the semiconductor substrate 100 contacted with the LDD.

In addition, a contact 90 is formed in the drain region 80 such that it is electrically connected with an outside.

As shown in FIG. 1 to FIG. 3, the dielectric layer 40 insulates between the floating gate 30 and control gate 50, and high voltage may be required for performing a program operation by moving hot electrons from the control gate 50 to the floating gate 30 through the dielectric layer 40. However, since a transistor of a charging pump needs to have a larger size than a predetermined size in order to apply high voltage, chip size may be increased.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a flash memory device and a method manufacturing the same having advantages of performing a program operation for a flash memory device under a low voltage by increasing capacitance between the floating gate and the control gate.

The capacitance between the floating gate and the control gate can be increased by forming protrusions and depressions on the floating gate.

An exemplary flash memory device according to an embodiment of the present invention includes a semiconductor substrate, a gate oxide layer formed on portions of the semiconductor substrate, a floating gate formed on the gate oxide layer having protrusions and depressions on its surface, a dielectric layer formed on the floating gate, and a control gate formed on the dielectric layer.

The dielectric layer may be composed of an ONO (oxide-nitride-oxide) structure in which an oxide layer, a nitride layer, and an oxide layer are sequentially accumulated.

The floating gate and the control gate may be composed of polysilicon.

The protrusions and depressions have round edges.

An exemplary method of manufacturing a flash memory device according to the present invention includes forming a gate oxide layer on a semiconductor substrate, forming a floating gate including protrusions and depressions on its surface by patterning polysilicon deposited on the gate oxide layer, depositing a dielectric layer on the floating gate and the gate oxide layer, and forming a control gate by patterning polysilicon deposited on the dielectric layer.

The protrusions and depressions on the surface of the floating gate may be formed by patterning the polysilicon by using a slit mask such that a height difference is created on the surface of the floating gate.

The forming of the floating gate including protrusions and depressions on its surface may include performing an exposure and development process for a first photoresist deposited on the polysilicon, forming grooves in the polysilicon by etching a surface of the polysilicon by using the first photoresist as a mask, removing the first photoresist, performing an exposure and development process for a second photoresist deposited on the polysilicon, and patterning the polysilicon and the gate oxide layer by using the second photoresist as a mask.

Between removing the first photoresist and performing the exposure and development process for the second photoresist, the method may further include filling the grooves in the polysilicon by using a third photoresist and performing an etch back for the third photoresist.

The exposure and development process for the first photoresist deposited on the polysilicon may be performed by using a curved mask.

The forming of the grooves in the polysilicon by etching the surface of the polysilicon may be performed by using a round etching.

The grooves in the polysilicon formed by etching the surface of the polysilicon may be formed in a long line shape.

The grooves in the polysilicon formed by etching the surface of the polysilicon may have a gap of 45 nm between adjacent grooves.

The first photoresist may be removed by using a wet cleaning, and the etch back for the third photoresist may also be performed by using a wet cleaning.

DETAILED DESCRIPTION OF THE EMBODIMENTS

Figure 1:
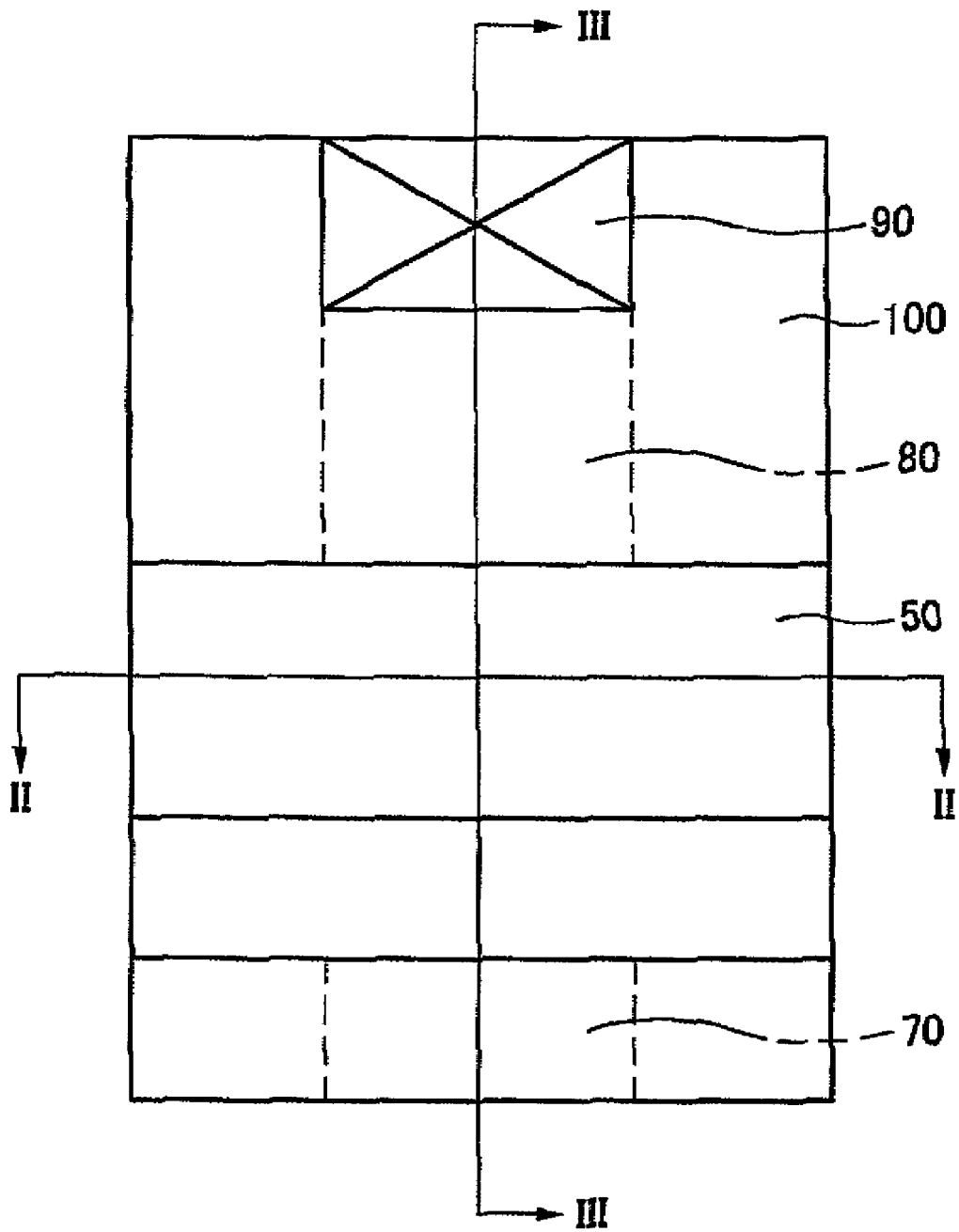
FIG. 1 is a top plan view showing a single cell in a conventional flash memory device.
Figure 2:
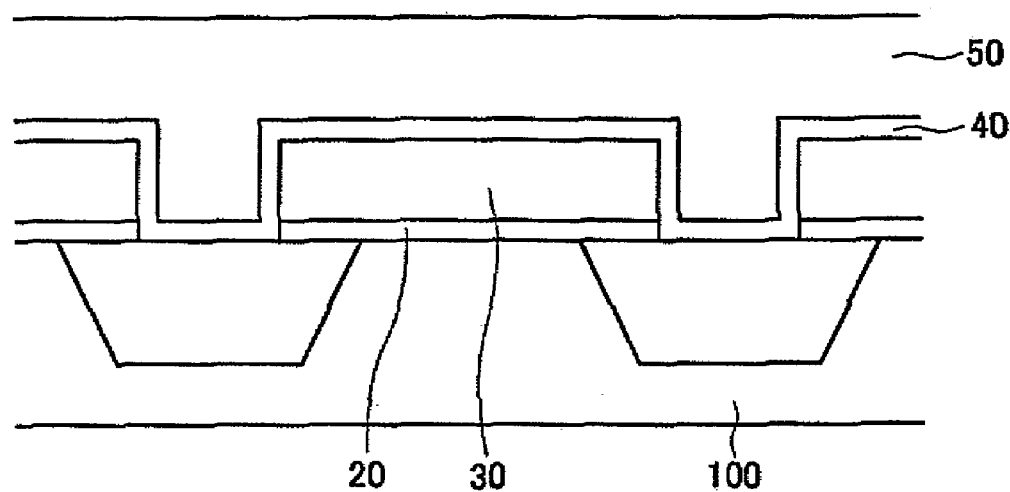
FIG. 2 and FIG. 3 are cross-sectional views with respect to lines II-II and III-III in FIG. 1.
Figure 3:
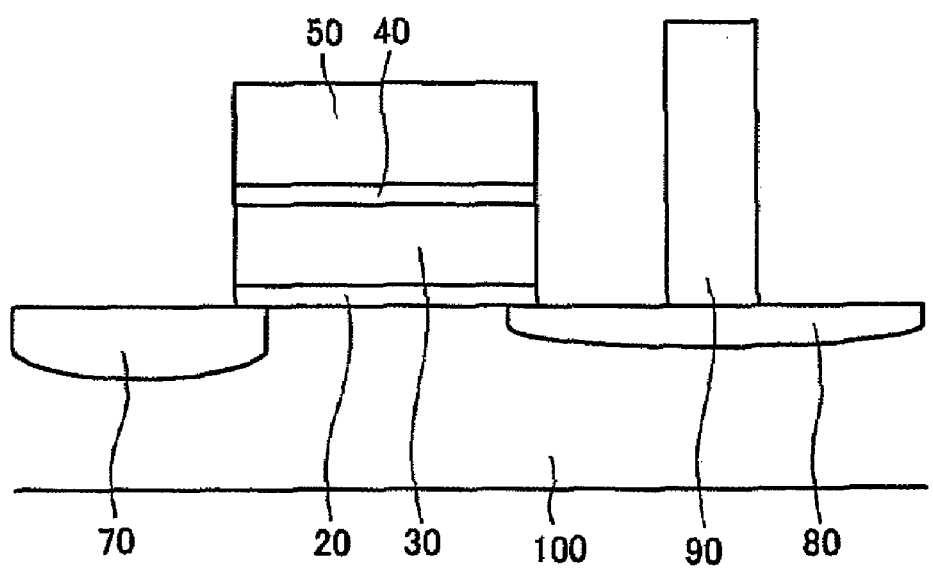

With reference to the accompanying drawings, the present invention will be described in order for those skilled in the art to be able to implement the invention. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate, is positioned on another part, it means the part is directly on the other part or above the other part with at least one intermediate part. On the other hand, if any part is said to be positioned directly on another part it means that there is no intermediate part between the two parts.

Hereinafter, a flash memory device according to an exemplary embodiment of the present invention will be described in detail with reference to FIG. 5 and FIG. 6.

Figure 5:
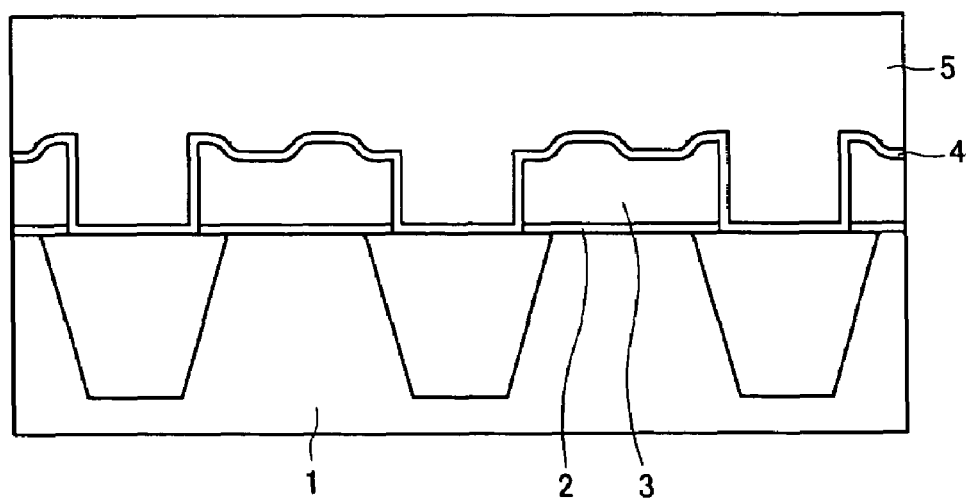
FIG. 5 and FIG. 6 are cross-sectional views showing a flash memory device according to an exemplary embodiment of the present invention.
Figure 6:
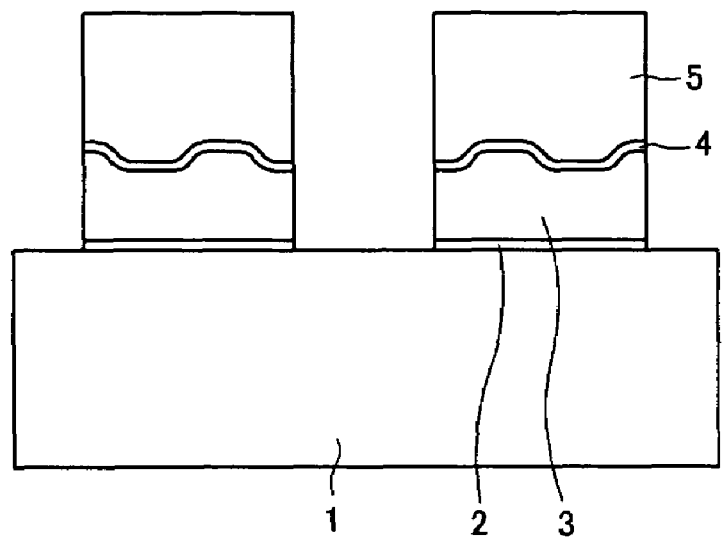

FIG. 5 and FIG. 6 are cross-sectional views showing a flash memory device according to an exemplary embodiment of the present invention.

According to an exemplary embodiment of the present invention, a gate oxide layer 2 is formed on a portion of a device region in a semiconductor substrate 1, and then a floating gate 3 including polysilicon is formed on the gate oxide layer 2. The floating gate 3 has protrusions and depressions on its surface and is not electrically connected to an outside.

In addition, a dielectric layer 4 is formed on the floating gate 3, and it includes an ONO structure in which an oxide layer, a nitride layer, and an oxide layer are sequentially accumulated. The dielectric layer 4 also has protrusions and depressions according to the protrusions and depressions formed on the surface of the floating gate 3.

Subsequently, a control gate 5 including polysilicon is formed on the dielectric layer 4. Since the control gate 5 is formed covering the protrusions and depressions on the dielectric layer 4, the control gate 5 and floating gate 3 overlap over a wider area. Accordingly, capacitance between the control gate 5 and floating gate 3 may be increased.

Figure 4:
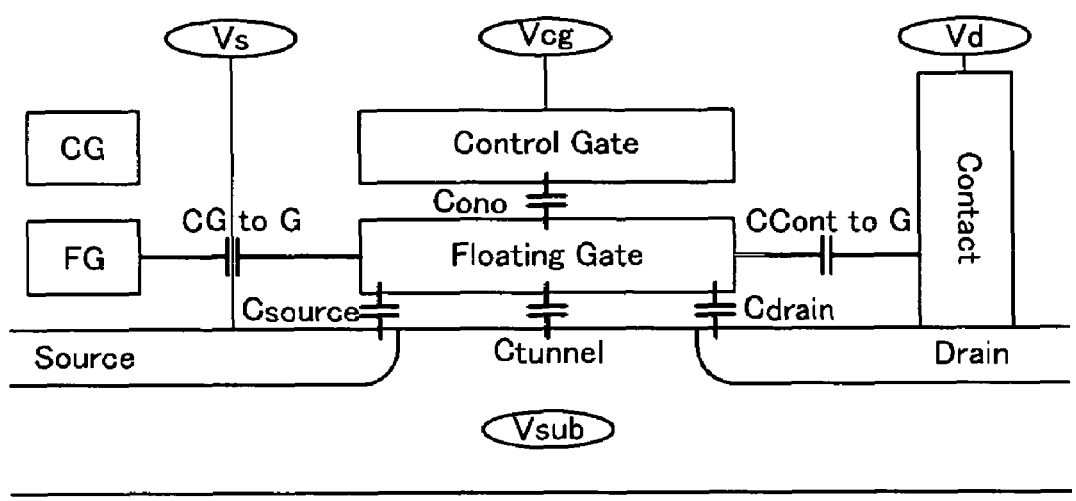
FIG. 4 is a drawing showing a relation between voltage and capacitance in a flash memory device.

FIG. 4 is a drawing showing a relation between voltage and capacitance in a flash memory device. Hereinafter, a relation between capacitance for the control gate 5 and the floating gate 3 and a coupling ratio (C/R) will be described with reference to FIG. 4 to FIG. 6.

FIG. 4 shows a relation between voltage and capacitance in a unit cell in a flash memory. There are four types of voltages applied from outside, such as voltage applied at a source (Vs), voltage applied at a drain through a contact (Vd), voltage applied at a control gate (Vcg), and voltage in the substrate (Vsub). Further, there are several types of capacitances as follows. $C_{source}$ denotes capacitance between the floating gate 3 and the source region, $C_{drain}$ denotes capacitance between the floating gate 3 and the drain region, and $C_{tunnel}$ denotes capacitance between the floating gate 3 and the substrate 1. In addition, $C_{ono}$ denotes capacitance between the floating gate 3 and the control gate 5, $C_{GtoG}$ denotes capacitance between adjacent floating gates 3, and $C_{ContoG}$ denotes capacitance between the contact and the floating gate 3.

The coupling ratio is determined by the following equation.

$$C/R = \frac{C_{ono}}{C_{tunnel} + C_{drain} + C_{source} + C_{ono} + C_{GtoG} + C_{ContoG}} \quad \text{(Equation 1)}$$
$$\cong \frac{C_{ono}}{C_{tunnel} + C_{ono} + C_{GtoG} + C_{ContoG}}$$

Here, the $C_{drain}$ and $C_{source}$ are negligibly small relative to the other capacitances.

The coupling ratio (C/R) is an important factor in a flash memory device because voltage applied at the control gate is applied at the floating gate according to the coupling ratio. Accordingly, when the coupling ratio is high, a program operation for the floating gate can be performed even under a lower voltage. According to an exemplary embodiment of the present invention, capacitance ($C_{ono}$) between the floating gate 3 and control gate 5 may be increased by forming the protrusions and depressions on the floating gate 3 so that the coupling ratio (C/R) may be increased.

Hereinafter, a method of manufacturing a flash memory device according to an exemplary embodiment of the present invention will be described with reference to FIG. 7 to FIG. 13.

Referring to FIG. 7 to FIG. 13, an STI (shallow trench isolation) 10 is formed in a substrate 1, and a gate oxide layer 2 is formed on an entire surface of the substrate 1.

Generally, the STI 10 is formed by filling $SiO_2$ into a trench on the semiconductor substrate 1. Subsequently, a gate oxide layer 2 is formed by growing an oxide layer in an active region of the semiconductor substrate 1.

Figure 7:
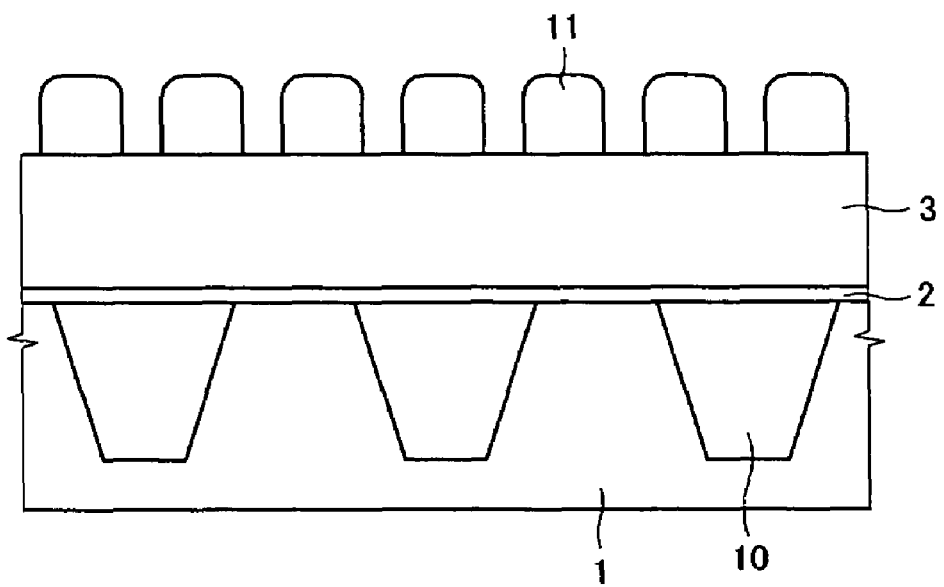
FIG. 7 to FIG. 13 are cross-sectional views showing a method of manufacturing a flash memory device according to an exemplary embodiment of the present invention.

Thereafter, as shown in FIG. 7, a first photoresist 11 is formed after depositing a polysilicon 3-1, and then it is patterned by using a first mask such that it has a plurality of grooves. At this time, the grooves may be formed in a long line shape. As shown in FIG. 7, the first photoresist 11 is patterned by using a mask which enables the first photoresist 11 to have a round edge. In addition, the narrower the groove widths of the first photoresist are, the more advantageous the grooves are. According to an exemplary embodiment of the present invention, the grooves of the first photoresist may have a width of about 45 nm.

Figure 8:
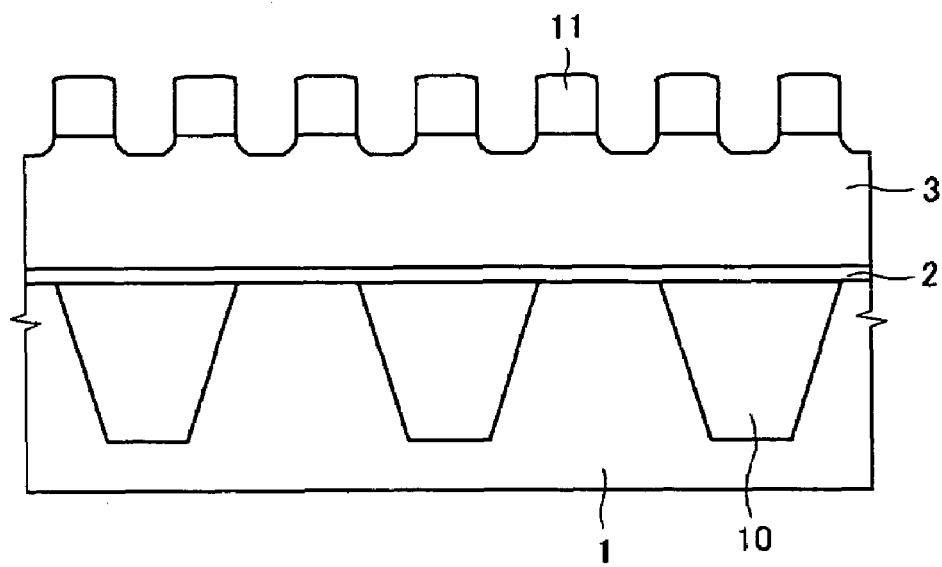

Subsequently, as shown in FIG. 8, the first photoresist 11 and the polysilicon 3-1 for forming the floating gate are etched by a dry etching. At this time, as shown in FIG. 8, a rounding etching may be performed such that the grooves formed in the polysilicon 3-1 have round edges.

Figure 9:
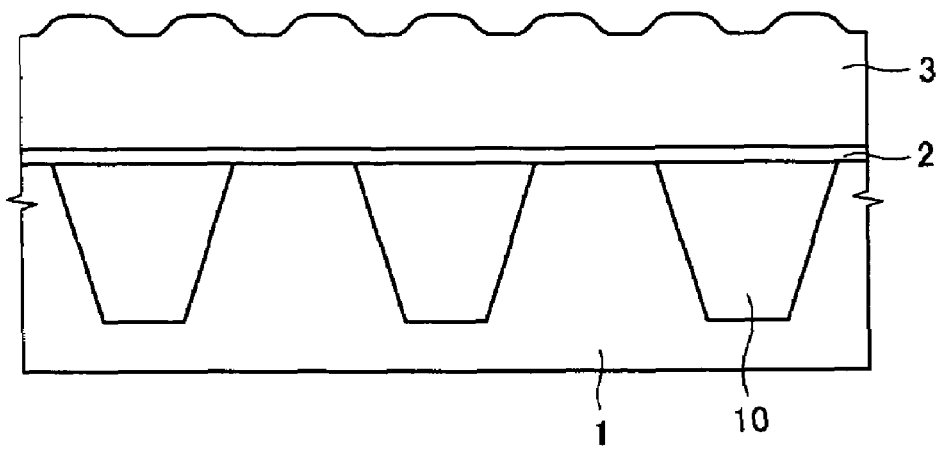

Subsequently, as shown in FIG. 9, the first photoresist 11 is removed. At this time, a wet cleaning may be performed so as to completely remove the first photoresist 11 such that a surface of the polysilicon 3-1 becomes clean.

Figure 10:
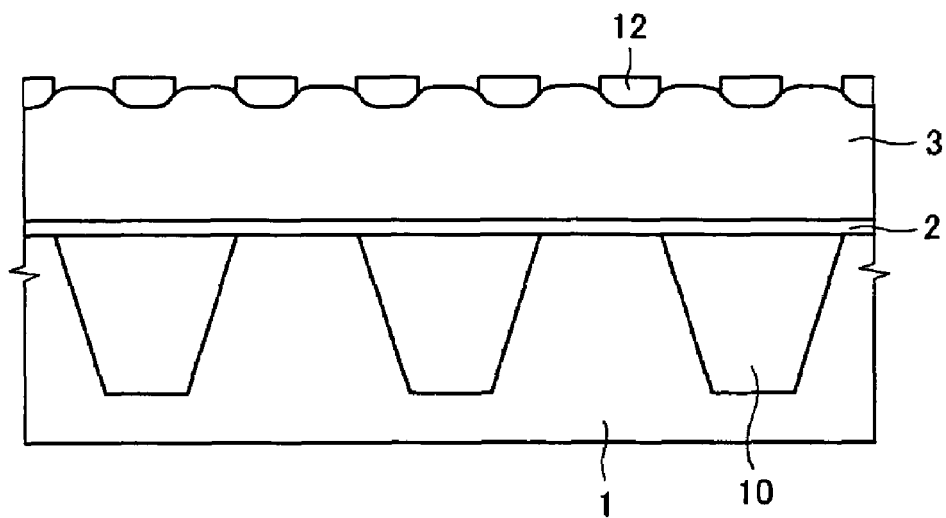
Figure 11:
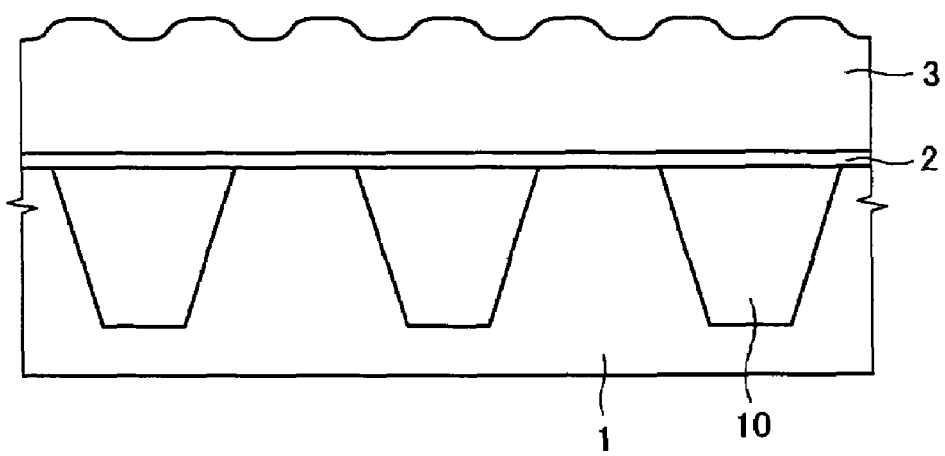

FIG. 10 and FIG. 11 show additional but not necessarily required processes by which protrusions and depressions formed on the floating gate 3 may have smooth curved edges.

As shown in FIG. 10, a second photoresist 12 fills in the grooves of the polysilicon 3-1 for forming the floating gate. Subsequently, surfaces of portions of the polysilicon 3-1 having no grooves are exposed by using a dry asher.

Thereafter, as shown in FIG. 11, the second photoresist 12 is removed by performing an etch back. At this time, a wet cleaning may be used so that the surface of the polysilicon 3-1 becomes clean.

Accordingly, the grooves of the polysilicon 3-1 have curved edges after performing the etch back.

Figure 12:
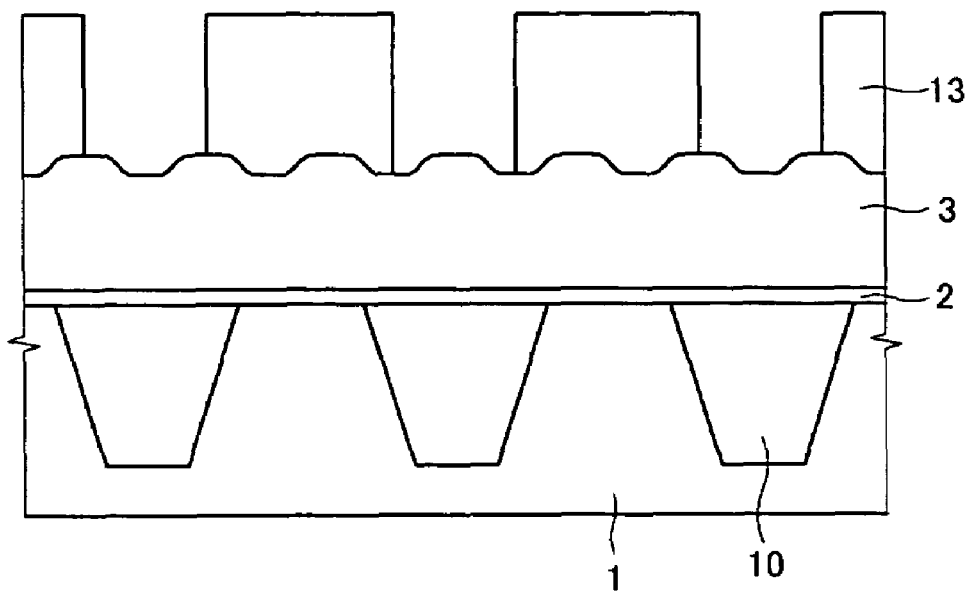

Subsequently, a third photoresist 13 is formed on the polysilicon 3-1, and then, as shown in FIG. 12, exposed portions of the third photoresist 13 are patterned by using a mask for a floating gate.

Figure 13:
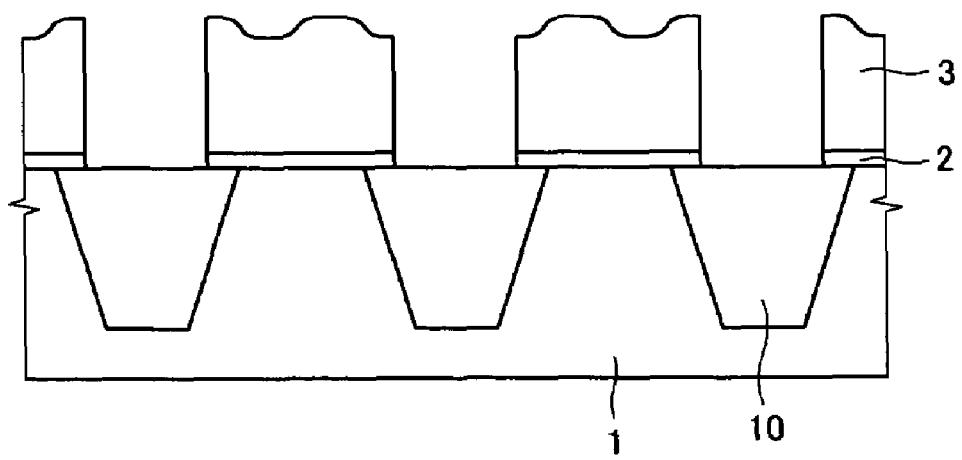

Thereafter, as shown in FIG. 13, the polysilicon 3-1 and gate oxide layer 2 are etched by using the third photoresist 13 as a mask. Consequently, a floating gate 3 including protrusions and depressions on its surface is formed by etching the polysilicon 3-1 including the grooves.

Subsequently, a dielectric layer 4 (referring to FIG. 6) is formed on the floating gate 3, and then the control gate 5 (referring to FIG. 6) including polysilicon is formed on the dielectric layer 4. The dielectric layer 4 is composed of a structure wherein an oxide layer, a nitride layer, and an oxide layer are sequentially accumulated.

While the protrusions and depressions may be formed on the floating gate 3 by the above-mentioned method, they can be formed by another method.

For example, the amount of photoresist remaining after the development process may be adjusted by controlling the amount of light exposed on the photoresist when using a slit mask. When such a photoresist is used for the mask for the etching process, the protrusions and depressions may be formed by controlling the etching amount.

As described above, since capacitance between the floating gate and the control gate may be enhanced by forming protrusions and depressions on the floating gate, the coupling ratio can be consequently increased. Therefore, program operations can be performed under low voltage.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a flash memory device, comprising:
    forming a gate oxide layer on a semiconductor substrate and a shallow trench isolation formed in the semiconductor substrate, wherein said gate oxide layer is formed to directly contact the uppermost surface of both the semiconductor substrate and the shallow trench isolation;
    depositing a first polysilicon layer on the gate oxide layer;
    performing a first exposure and development process for a first photoresist deposited on the first polysilicon layer;
    forming grooves in the first polysilicon layer by etching a surface of the first polysilicon layer by using the first photoresist as a mask;
    removing the first photoresist;
    filling the grooves in the first polysilicon layer using a third photoresist;
    performing an etch back for the third photoresist;
    performing a second exposure and development process for a second photoresist deposited on the first polysilicon layer;
    forming a floating gate including protrusions and depressions on the uppermost surface of the floating gate by patterning the first polysilicon layer and the gate oxide layer by using the second photoresist as a mask;
    depositing a dielectric layer on the floating gate and the gate oxide layer, wherein said dielectric layer is formed to directly contact the shallow trench isolation, the floating gate and sidewalls of the gate oxide layer; and
    forming a control gate by patterning a second polysilicon layer deposited on the dielectric layer.

2. The method of claim 1, wherein the protrusions and depressions on the surface of the floating gate are formed by patterning the first polysilicon layer by using a slit mask such that a height difference is created on the surface of the floating gate.

3. The method of claim 1, wherein the first exposure and development process for the first photoresist deposited on the first polysilicon layer is performed by using a curved mask.

4. The method of claim 1, wherein the forming of the grooves in the first polysilicon layer by etching the surface of the polysilicon is performed by using a round etching.

5. The method of claim 1, wherein the grooves formed in the first polysilicon layer by etching the surface of the first polysilicon layer are formed in a long line shape.

6. The method of claim 1, wherein the grooves formed in the first polysilicon layer by etching the surface of the first polysilicon layer have a gap of 45 nm between the adjacent grooves.

7. The method of claim 1, wherein the first photoresist is removed by using a wet etching.

8. The method of claim 1, wherein the etch back for the third photoresist is performed by using a wet etching.

9. A method of manufacturing a flash memory device, comprising:
    forming a gate oxide layer directly on an entire surface of a semiconductor substrate;
    depositing a first polysilicon layer directly on the gate oxide layer;
    forming a first photoresist directly on the first polysilicon layer and patterning the first photoresist using a first mask to forming a plurality of first photoresist patterns spaced apart by grooves 45 nm in width on the uppermost surface of the first polysilicon layer;
    removing the first photoresist patterns and performing a first cleaning of the uppermost surface of the first polysilicon layer;
    forming a second photoresist directly on the first polysilicon layer and in the grooves;
    exposing portions of the upper surface of the first polysilicon layer having no grooves using a dry ashing process;

removing the second photoresist and performing a second cleaning of the uppermost surface of the first polysilicon layer;

forming a third photoresist directly on the first polysilicon layer and in the grooves;

forming a floating gate having protrusions and depressions on an uppermost surface thereof by etching the first polysilicon layer and the gate oxide layer using the third photoresist as a mask; and then forming a dielectric layer on the semiconductor substrate including the floating gate and the gate oxide layer, wherein said dielectric layer is formed to directly contact the floating gate and the gate oxide layer; and forming a control gate on the dielectric layer.

10. The method of claim 9, further comprising, between forming the first photoresist and removing the first photoresist patterns:

performing a dry etching of the first photoresist patterns and the first polysilicon layer to round the edge of the grooves.

11. The method of claim 9, wherein removing the first photoresist patterns and performing the first cleaning of the surface of the first polysilicon layer comprises performing a wet etching process.

12. The method of claim 9, wherein removing the second photoresist and performing the second cleaning of the surface of the first polysilicon layer comprises performing an etch back using a second wet etching process.

13. The method of claim 9, wherein forming the dielectric layer comprises sequentially forming a first oxide layer, a nitride layer and a second oxide layer on the semiconductor substrate including the floating gate and the gate oxide layer.

14. The method of claim 9, wherein forming the control gate comprises depositing a second polysilicon layer on the dielectric layer.

* * * * *